United States Patent
Kamiya

(10) Patent No.: US 12,519,031 B2
(45) Date of Patent: Jan. 6, 2026

(54) SEMICONDUCTOR MODULE, SEMICONDUCTOR APPARATUS, AND VEHICLE

(71) Applicant: FUJI ELECTRIC CO., LTD., Kawasaki (JP)

(72) Inventor: Masahide Kamiya, Kawasaki (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 476 days.

(21) Appl. No.: 17/956,806

(22) Filed: Sep. 29, 2022

(65) Prior Publication Data

US 2023/0170277 A1    Jun. 1, 2023

(30) Foreign Application Priority Data

Nov. 30, 2021   (JP) .................... 2021-194852

(51) Int. Cl.
*H01L 23/373* (2006.01)
*H01L 23/00* (2006.01)
*H01L 23/367* (2006.01)

(52) U.S. Cl.
CPC ........ *H01L 23/3735* (2013.01); *H01L 23/367* (2013.01); *H01L 24/48* (2013.01); *H01L 2224/48227* (2013.01)

(58) Field of Classification Search
CPC ... H01L 23/3735; H01L 23/367; H01L 24/48; H01L 2224/48227; H01L 24/45;
(Continued)

(56) References Cited

U.S. PATENT DOCUMENTS

2016/0293563 A1* 10/2016 Fujino ................... H01L 23/24
2016/0294379 A1* 10/2016 Hayashiguchi ...... H03K 17/122
(Continued)

FOREIGN PATENT DOCUMENTS

JP      H10056130      2/1998
JP      2017162884 A   9/2017
(Continued)

OTHER PUBLICATIONS

Japanese Office Action issued for corresponding Japanese patent application JP2021-194852 dated Oct. 14, 2025.

*Primary Examiner* — Patricia D Valenzuela
(74) *Attorney, Agent, or Firm* — Rabin & Berdo, P.C.

(57) ABSTRACT

A semiconductor module includes a laminate substrate including a first circuit board on which a semiconductor device having a plurality of upper surface electrodes including a main electrode is disposed and a second circuit board, a main terminal electrically connected to the main electrode, an auxiliary terminal electrically connected to the one of the upper surface electrodes, and a main current wiring member electrically connecting the main electrode to the main terminal. A first path through which a first control current flows and a second path through which a second control current flows are provided between the one of the plurality of upper surface electrodes and the auxiliary terminal. The first control current flows via a first auxiliary wiring, and the second control current flows via the main current wiring member, the second circuit board and a second auxiliary wiring in this order.

18 Claims, 12 Drawing Sheets

(58) Field of Classification Search
CPC ... H01L 23/04; H01L 23/053; H01L 23/5386; H01L 23/24; H01L 24/40; H01L 24/49; H01L 23/49844; H01L 23/3736; H01L 23/49; H01L 23/49811; H01L 23/647
See application file for complete search history.

(56) References Cited

U.S. PATENT DOCUMENTS

| | | |
|---|---|---|
| 2020/0203327 A1 | 6/2020 | Oomori |
| 2020/0273760 A1 | 8/2020 | Fukumoto et al. |
| 2021/0120706 A1 | 4/2021 | Sato |

FOREIGN PATENT DOCUMENTS

| | | |
|---|---|---|
| JP | 2019071490 A | 5/2019 |
| JP | 2021068740 A | 4/2021 |
| WO | 2018235511 A1 | 12/2018 |
| WO | 2019053942 A1 | 3/2019 |

\* cited by examiner

SEMICONDUCTOR MODULE, SEMICONDUCTOR APPARATUS, AND VEHICLE

CROSS REFERENCE TO RELATED APPLICATIONS

This application is based upon and claims the benefit of priority of the prior Japanese Patent Application No. 2021-194852, filed on Nov. 30, 2021, the entire contents of which are incorporated herein by reference.

BACKGROUND OF THE INVENTION

Field of the Invention

The present invention relates to a semiconductor module, a semiconductor apparatus, and a vehicle.

Description of the Related Art

A semiconductor module includes a substrate provided with a semiconductor device such as an IGBT (insulated gate bipolar transistor), a power MOSFET (metal oxide semiconductor field effect transistor), or an FWD (free wheeling diode), and is used for an inverter apparatus or the like.

In this type of semiconductor module, a semiconductor device is arranged on an upper surface of a laminate substrate, as shown in Japanese Patent Laid-Open No. 2021-068740, for example. A plurality of electrodes (including a main electrode, a gate electrode, and a sense electrode) are formed on an upper surface of the semiconductor device. For example, the main electrode of the semiconductor device is electrically connected to a main terminal for external connection via wiring members such as a circuit board and a wire. The wiring members forming a part of a current path flowing through the main terminal may be referred to as a main current wiring member, for example.

A control wiring for controlling a switching operation is connected to the semiconductor device. For example, the gate electrode of the semiconductor device is connected to an external gate terminal via a gate wiring. Further, the main electrode or the sense electrode of the semiconductor device is connected to an external auxiliary electrode via an auxiliary wiring to correspond to the gate wiring. Such a connection wiring may be referred to as a control wiring member, for example.

SUMMARY OF THE INVENTION

In a semiconductor module, a current flowing through a control wiring is smaller than that through a main current wiring. Accordingly, a relatively thin bonding wire is adopted for the control wiring. One end of the control wiring is connected to a surface of a semiconductor device that generates heat as a switching operation is performed. In this case, it is assumed that the control wiring deteriorates with a heat cycle, finally leading to disconnection. As a result, an operation of the semiconductor module may be affected. Accordingly, it has been desirable to early find the disconnection.

The present invention has been made in view of such points, and is directed to providing a semiconductor module capable of early finding disconnection of a specific wiring.

According to an aspect of the present invention, a semiconductor module includes a semiconductor device having a plurality of upper surface electrodes including at least a first main electrode formed on its upper surface, a laminate substrate in which a plurality of circuit boards including a first circuit board, on which the semiconductor device is arranged, and a second circuit board are arranged on an upper surface of an insulating plate, a first main terminal to be electrically connected to the first main electrode, an auxiliary terminal to be electrically connected to the upper surface electrode, and a main current wiring member that electrically connects the first main electrode and the first main terminal to each other, in which there is provided between the first main electrode and the first main terminal a main current path electrically connected to the first main terminal from the first main electrode via the main current wiring member and the second circuit board in this order, and there are provided between the upper surface electrode and the auxiliary terminal a first path electrically connected to the auxiliary terminal from the upper surface electrode via a first auxiliary wiring and a second path electrically connected to the auxiliary terminal from the upper surface electrode via the main current wiring member, the second circuit board, and a second auxiliary wiring in this order.

According to the present invention, disconnection of a specific wiring can be early found.

DETAILED DESCRIPTION OF THE PREFERRED EMBODIMENT

Figure 1:
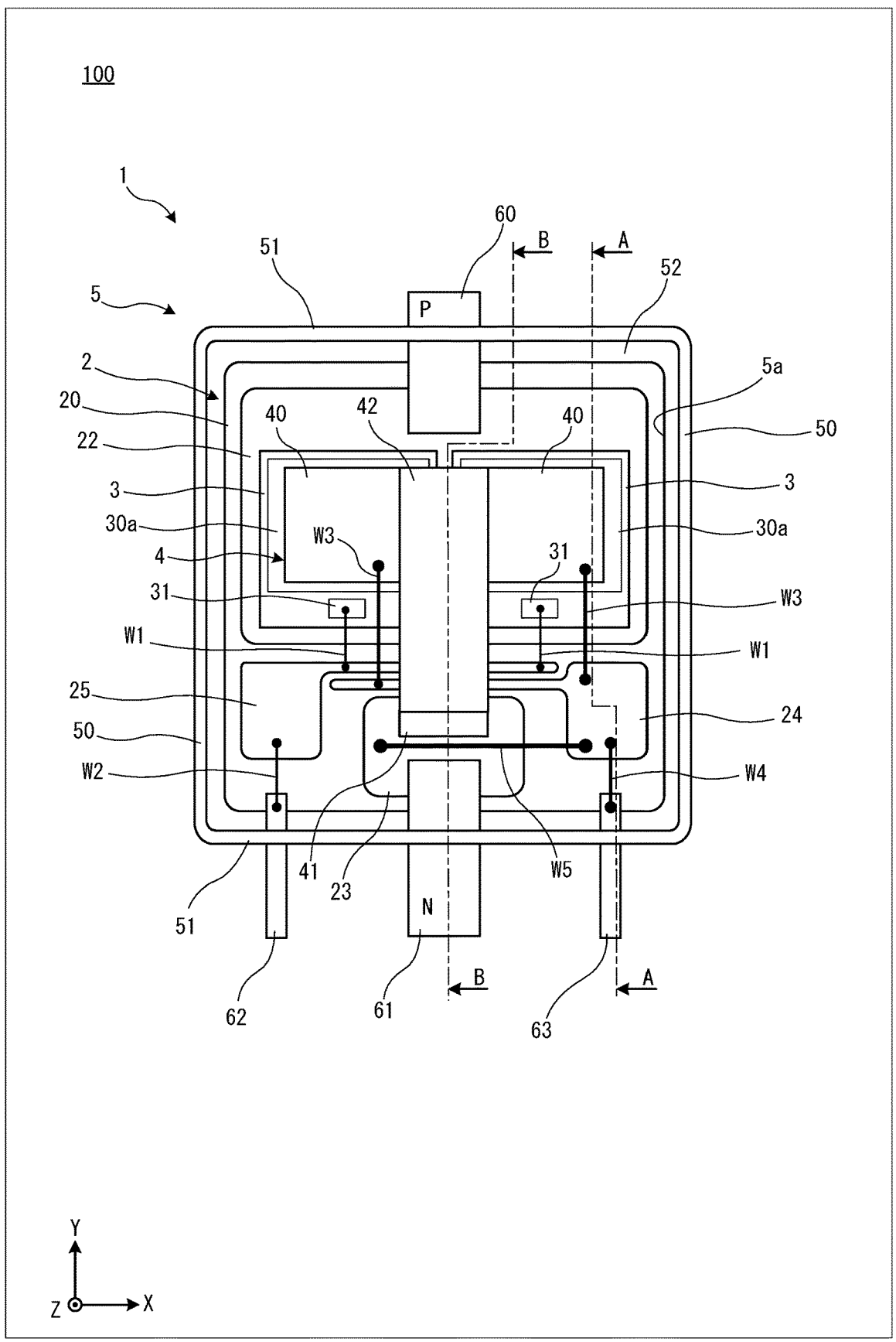
FIG. 1 is a plan view of a semiconductor apparatus according to an embodiment.
Figure 2:
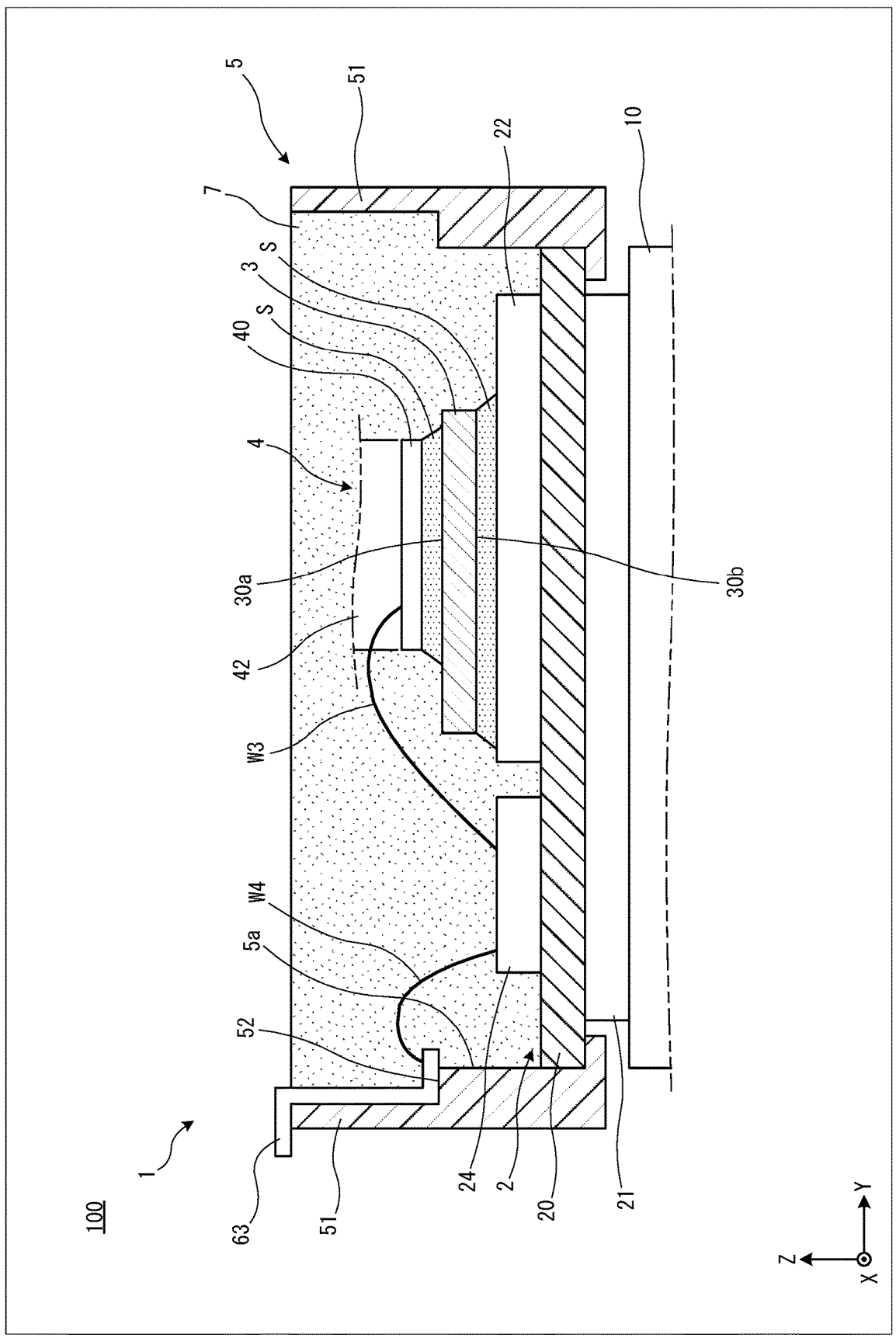
FIG. 2 is a cross-sectional view taken along a line A-A of the semiconductor apparatus illustrated in FIG. 1.
Figure 3:
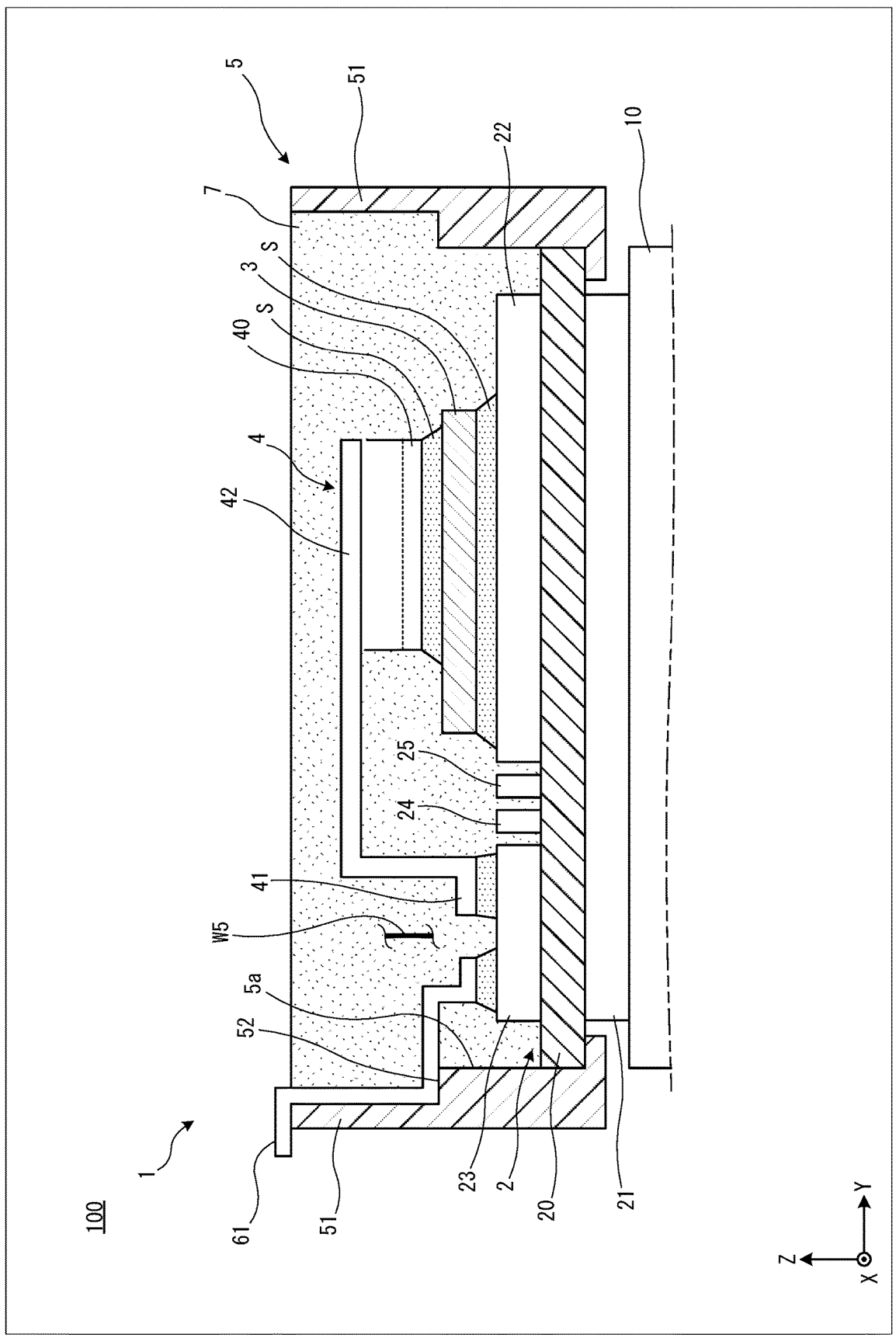
FIG. 3 is a cross-sectional view taken along a line B-B of the semiconductor apparatus illustrated in FIG. 1.
Figure 4:
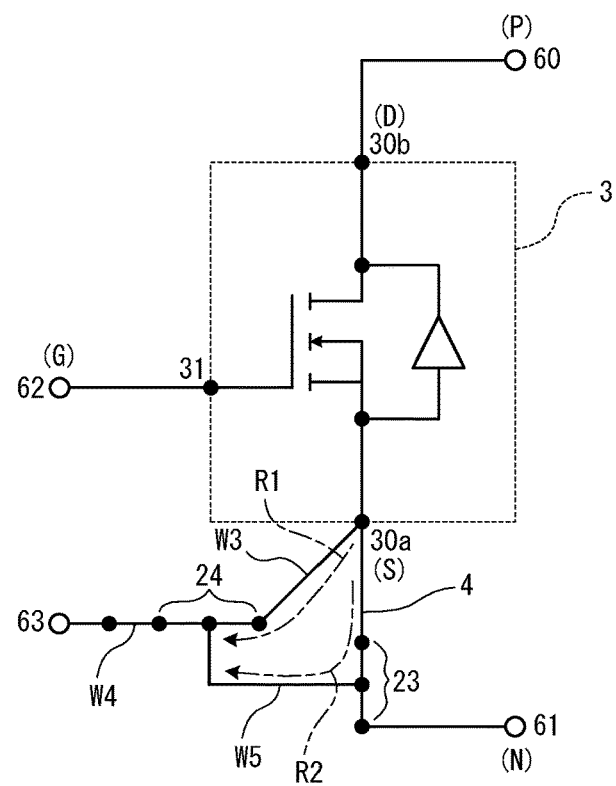
FIG. 4 is an equivalent circuit diagram of the semiconductor apparatus according to the present embodiment.

A semiconductor module and a semiconductor apparatus to which the present invention is applicable will be described below. FIG. 1 is a plan view of the semiconductor apparatus according to the present embodiment. FIG. 2 is a cross-sectional view taken along a line A-A of the semiconductor apparatus illustrated in FIG. 1. FIG. 3 is a cross-sectional view taken along a line B-B of the semiconductor apparatus illustrated in FIG. 1. FIG. 4 is an equivalent circuit diagram of the semiconductor apparatus according to the present embodiment.

In the following drawings, a direction in which a plurality of semiconductor devices are arranged, a direction in which paired main terminals oppose each other, a height direction of the semiconductor apparatus (a thickness direction of a substrate) are respectively defined as an X-direction, a Y-direction, and a Z-direction. X-, Y-, and Z-axes as illustrated are perpendicular to one another, to constitute a right-hand system. In some cases, the X-direction, the Y-direction, and the Z-direction may be respectively referred to as a left-right direction, a front-rear direction, and an up-down direction. The directions (front-rear, left-right, and up-down directions) are phrases used for convenience of illustration, and a correspondence with each of the X-, Y-, and Z-directions may change depending on an attachment posture of the semiconductor apparatus. For example, the heat dissipation surface side (cooler side) of the semiconductor apparatus and the opposite side thereof may be respectively referred to as the lower surface side and the upper surface side. In this specification, a planar view means a case where an upper surface or a lower surface of the semiconductor apparatus is viewed in the Z-direction. Respective aspect ratios and magnitude relationships among members in the drawings do not necessarily match one another because they are merely represented with schematic views. For convenience of illustration, a case where the magnitude relationship among members is exaggerated is also assumed.

A semiconductor apparatus 100 according to the present embodiment is a power conversion apparatus to be applied to an inverter of an industrial or in-vehicle motor, for example. As illustrated in FIGS. 1 to 3, the semiconductor apparatus 100 is configured by arranging a semiconductor module 1 on an upper surface of a cooler 10. In contrast with the semiconductor module 1, the cooler 10 has any configuration.

The cooler 10 dissipates heat of the semiconductor module 1 to the exterior, and has a rectangular parallelepiped shape as a whole. Not shown in particular, the cooler 10 is configured by providing a plurality of fins on the lower surface side of a base plate and accommodating the fins in a water jacket. The cooler 10 is not limited to this, but is appropriately changeable.

The semiconductor module 1 is configured by arranging a laminate substrate 2, a semiconductor device 3, a metal wiring board 4, and the like in a case 5.

The laminate substrate 2 is composed of a DCB (direct copper bonding) substrate, an AMB (active metal brazing) substrate, or a metal base substrate, for example. The laminate substrate 2 is configured by laminating an insulating plate 20, a heat dissipation plate 21, and a plurality of circuit boards 22 to 25, and is formed into a rectangular shape (or a square shape) in a planar view as a whole.

Specifically, the insulating plate 20 is formed of a plate-shaped body having an upper surface and a lower surface on its XY surface, and has a rectangular shape in a planar view. The insulating plate 20 may be formed of a ceramic material such as aluminum oxide ($Al_2O_3$), aluminum nitride (AlN), silicon nitride ($Si_3N_4$), aluminum oxide ($Al_2O_3$), or zirconium oxide ($ZrO_2$).

The insulating plate 20 may be formed of thermosetting resin such as epoxy resin or polyimide resin or a composite material of thermosetting resin and glass or a ceramic material used as a filler. The insulating plate 20 may be preferably formed of a material having flexibility and containing thermosetting resin, for example. The insulating plate 20 may be referred to as an insulating layer or an insulating film.

The heat dissipation plate 21 has a predetermined thickness in a Z-direction, and has a rectangular shape in a planar view. The heat dissipation plate 21 is formed of a metal plate having good thermal conductivity such as copper or aluminum. The heat dissipation plate 21 is arranged on a lower surface of the insulating plate 20. A lower surface of the heat dissipation plate 21 is a surface to be attached to the cooler 10. The lower surface of the heat dissipation plate 21 also functions as a heat dissipation surface (heat dissipation region) for dissipating heat of the semiconductor module 1. The heat dissipation plate 21 is bonded to an upper surface of the cooler 10 via a bonding material (not illustrated) such as a solder. The heat dissipation plate 21 may be arranged on the upper surface of the cooler 10 via a thermally conductive material such as a thermal grease or a thermal compound.

The plurality of circuit boards 22 to 25 respectively have predetermined thicknesses, and are respectively arranged at predetermined portions on the upper surface of the insulating plate 20. The circuit boards are respectively formed into island shapes electrically independent of one another. For example, the circuit board 22 (a first circuit board) has a rectangular shape in a planar view that is long in an X-direction, and is arranged offset toward the positive side in a Y-direction on the insulating plate 20.

The circuit board 23 (a second circuit board) has a rectangular shape (or a square shape) in a planar view, and is arranged adjacent on the negative side in the Y-direction to the circuit board 22. More specifically, the circuit board 23 is offset toward the negative side in the Y-direction and is arranged substantially at the center in the X-direction on the insulating plate 20. Although described in detail below, the circuit boards 22 and 23 constitute a part of a main current path through which a main current flows.

The circuit board 24 (a third circuit board) has a rectangular shape (or a square shape) in a planar view, and is arranged in a corner portion on the positive side in the X-direction and on the negative side in the Y-direction on the insulating plate 20. That is, a portion having a rectangular shape of the circuit board 24 is arranged adjacent on the positive side in the X-direction to the circuit board 23 and adjacent on the negative side in the Y-direction to the circuit board 22. The circuit board 24 has an elongated portion extending toward the negative side in the Y-direction from an end of one side of the rectangular shape. The elongated portion passes below the metal wiring board 4 (a connection section 42), described below.

The circuit board 25 (a fourth circuit board) has a rectangular shape (or a square shape) in a planar view, and is arranged in a corner portion on the negative side in the X-direction and on the negative side in the Y-direction on the insulating plate 20. That is, a portion having a rectangular shape of the circuit board 25 is arranged adjacent on the negative side in the X-direction to the circuit board 23 and adjacent on the negative side in the Y-direction to the circuit board 22. The circuit board 25 has an elongated portion extending toward the positive side in the Y-direction from an end of one side of the rectangular shape. The elongated portion passes below the metal wiring board 4 (the connection section 42), described below. The circuit board 23 is arranged to be interposed between the circuit boards 24 and 25 in the X-direction. The circuit boards 24 and 25 each function as a circuit board for relaying a control signal (a part of a control signal path).

Respective shapes, arrangement portions, and numbers of arrangements of the circuit boards to be thus configured are not limited to these, but are appropriately changeable. The circuit boards 22 to 25 may be each formed of a metal plate having good thermal conductivity such as copper or aluminum. Further, the circuit boards 22 to 25 may be referred to as a circuit layer or a circuit pattern.

A plurality of (two in the present embodiment) semiconductor devices 3 are arranged via a bonding material S such as a solder on an upper surface of the circuit board 22. The semiconductor device 3 is formed into a rectangular shape in a planar view of a semiconductor substrate made of silicon (Si), for example.

The semiconductor device 3 may be composed of a wide bandgap semiconductor device (that may be referred to as a wide gap semiconductor device) formed of a wide bandgap semiconductor substrate made of silicon carbide (SiC), gallium nitride (GaN), diamond, or the like in addition to silicon, described above.

A switching element such as an IGBT (insulated gate bipolar transistor) or a power MOSFET (metal oxide semiconductor field effect transistor), or a diode such as an FWD (free wheeling diode) may be used for the semiconductor device 3.

As illustrated in FIG. 4, for example, the semiconductor device 3 may be composed of a MOSFET. A diode (an FWD, described below) may be contained in the MOSFET. In the present embodiment, an SiC-MOSFET containing a diode will be described as an example. In addition thereto, the semiconductor device 3 may be composed of an RC (reverse conducting)-IGBT element obtained by integrating respective functions of an IGBT (insulated gate bipolar transistor) element and an FWD (free wheeling diode) element.

The semiconductor device is not limited to this, but may be configured by combining a switching element, a diode, and the like, described above. For example, the IGBT element and the FWD element may be separately configured. An RB (reverse blocking)-IGBT or the like sufficiently resistant to a reverse bias may be used as the semiconductor device 3. A shape, a number of arrangements, and an arrangement portion of the semiconductor device 3 are appropriately changeable.

The semiconductor device 3 to be thus configured has an upper surface and a lower surface on its XY surface, and electrodes are respectively formed on the upper surface and the lower surface. For example, a main electrode 30a and a gate electrode 31 are formed on the upper surface of the semiconductor device 3, and a main electrode 30b is also formed on the lower surface of the semiconductor device 3.

If the semiconductor device 3 is a MOSFET element, for example, the main electrode 30a may be referred to as a source electrode, and the main electrode 30b on the lower surface side may be referred to as a drain electrode. If the semiconductor device 3 is an IGBT element, the main electrode 30a may be referred to as an emitter electrode, and the main electrode 30b on the lower surface side may be referred to as a collector electrode. The gate electrode 31 may be referred to as a gate electrode regardless of the type of the element. An auxiliary electrode 32 (see a modification, described below) may be provided separately from the main electrode 30a on the upper surface of the semiconductor device 3. The electrodes (the main electrode 30a, the gate electrode 31, and the auxiliary electrode 32) formed on the upper surface of the semiconductor device 3 may be collectively referred to as an upper surface electrode, and the electrode formed on the lower surface of the semiconductor device 3 may be referred to as a lower surface electrode. The gate electrode 31 and the auxiliary electrode 32 in the upper surface electrode may be each referred to as a control electrode.

In the present embodiment, the main electrode 30a is an electrode through which a main current flows, and is formed into a rectangular shape in a planar view having an area representing a large part of the upper surface of the semiconductor device 3. On the other hand, the gate electrode 31 is an electrode for controlling a gate for turning on and off a main current, is formed into a rectangular shape in a planar view sufficiently smaller than the main electrode 30a, and is arranged offset toward one side of the semiconductor device 3. An arrangement of the electrodes is not limited to this, but is appropriately changeable.

The semiconductor device 3 in the present embodiment may be a so-called vertical switching element obtained by forming functional elements such as a transistor in a thickness direction on the semiconductor substrate, or may be a horizontal switching element obtained by forming the functional elements in a planar direction.

The main electrode 30a of the semiconductor device 3 and an upper surface of the circuit board 23 are electrically connected to each other by the metal wiring board 4. The metal wiring board 4 constitutes a main current wiring member, and functions as a part of a path of a main current (a main current path) flowing in the semiconductor module 1.

The metal wiring board 4 is composed of a plate-shaped body having an upper surface (upper main surface) and a lower surface (lower main surface). The thickness of the metal wiring board 4 may be not less than 0.1 nor more than 2.5 mm. The metal wiring board 4 is formed of a metal material such as a copper material, a copper alloy-based material, an aluminum alloy-based material, or an iron alloy-based material. The metal wiring board 4 is formed into a predetermined shape by press working, for example. A shape of the metal wiring board 4 described below merely represents an example, and is appropriately changeable. The metal wiring board 4 may be referred to as a lead frame. The main current wiring member is not limited to the metal wiring board 4, but may be composed of a bonding wire.

The metal wiring board 4 according to the present embodiment has a T shape in a planar view, and is formed upon being bent a plurality of times in a side view. Specifically, the metal wiring board 4 includes two first bonding sections 40 to be each bonded to the main electrode 30a via a bonding material S, a second bonding section 41 to be bonded to the upper surface of the circuit board 23 via a bonding material S, and the connection section 42 that connects the first bonding sections 40 and the second bonding section 41 to each other. The bonding material S may be a material having conductivity, for example, a solder or a metallic sintered material.

Each of the first bonding sections 40 includes a plate-shaped portion formed into a smaller rectangular shape than an outer shape of the semiconductor device 3 (the main electrode 30a) in a planar view, having an upper surface and a lower surface on its XY surface, and having a thickness in the Z-direction. In the present embodiment, the two first bonding sections 40 are provided to correspond to the number of semiconductor devices 3. The two first bonding sections 40 are arranged side by side in the X-direction, and are connected to the connection section 42 therebetween. Each of the first bonding sections 40 is arranged in the z direction to oppose the upper surface electrode (the main electrode 30a) of the semiconductor device 3, and is bonded thereto via a bonding material S.

The second bonding section 41 includes a plate-shaped portion formed into a smaller rectangular shape than an outer shape of the circuit board 23 in a planar view, having an upper surface and a lower surface on its XY surface, and having a thickness in the Z-direction. One end of the second bonding section 41 is bonded to the circuit board 23, while the other end of the second bonding section 41 is connected to the connection sections 42.

The connection section 42 includes two first rising portions respectively having planes on their rising YZ surfaces on the positive side in the Z-direction from edge portions of the two first bonding sections 40 corresponding to the number of semiconductor devices 3 and each having a thickness in the X-direction, a second rising portion having a plane on its rising XZ surface on the positive side in the Z-direction from an edge portion of the second bonding section 41 and having a thickness in the Y-direction, and a connection section having an upper surface and a lower surface on its XY surface, having a thickness in the Z-direction, and connecting the first rising portions and the second rising portion to each other.

The case 5 is arranged at an outer peripheral edge of the laminate substrate 2. The case 5 is formed into a rectangular frame shape in a planar view to surround the outer periphery of the laminate substrate 2, and has an opening section 5*a* having a rectangular shape at its center. Specifically, the case 5 includes a pair of side walls 50 opposing each other in the X-direction and a pair of side walls 51 opposing each other in the Y-direction, and is formed into a rectangular frame shape by connecting their respective end portions to each other. Thus, the case 5 surrounds the laminate substrate 2, and accommodates the semiconductor device 3 and the metal wiring board 4 inside.

The pair of side walls 50 rises in the Z-direction, and extends in the Y-direction. The pair of side walls 51 rises in the Z-direction, and extends in the X-direction. A stepped section 52 that falls by one step is formed inside each of the side walls 50 and 51.

The case 5 is provided with main terminals 60 and 61 for main current and control terminals for control (a gate terminal 62 and an auxiliary terminal 63, described below). The main terminals 60 and 61 are each formed of a plate-shaped elongated body, and are respectively embedded substantially at centers in the X-direction of the side walls 51. The main terminals 60 and 61 are arranged to oppose each other in the Y-direction.

The main terminal 60 constitutes a positive electrode terminal (P terminal), and is embedded in the side wall 51 on the positive side in the Y-direction. One end of the main terminal 60 protrudes outward (toward the positive side in the Y-direction) from the side wall 51. The other end of the main terminal 60 is electrically connected to the circuit board 22 inside the side wall 51. Therefore, the main terminal 60 is electrically connected to the main electrode 30*b* (the lower surface electrode) of the semiconductor device 3 via the circuit board 22.

The main terminal 61 constitutes a negative electrode terminal (N terminal), and is embedded in the side wall 51 on the negative side in the Y-direction. One end of the main terminal 61 protrudes outward (toward the negative side in the Y-direction) from the side wall 51. The other end of the main terminal 61 is electrically connected to the circuit board 23 inside the side wall 51. Therefore, the main terminal 61 is electrically connected to the main electrode 30*a* of the semiconductor device 3 via the circuit board 23 and the metal wiring board 4.

The control terminals include the gate terminal 62 and the auxiliary terminal 63. The gate terminal 62 and the auxiliary terminal 63 are each formed in a plate-shaped elongated body, and are embedded in the side wall 51 on the negative side in the Y-direction. Respective one ends of the gate terminal 62 and the auxiliary terminal 63 protrude outward (toward the negative side in the Y-direction) from the side wall 51. The respective other ends of the gate terminal 62 and the auxiliary terminal 63 penetrate into the side wall 51, and are respectively electrically connected to the circuit board 25 and the circuit board 24. Therefore, the gate terminal 62 and the gate electrode 31 of the semiconductor device 3 are electrically connected to each other, and the auxiliary terminal 63 and the main electrode 30*a* of the semiconductor device 3 are electrically connected to each other. The gate terminal 62 and the auxiliary terminal 63 are arranged to oppose each other in the X-direction with the main terminal 61 interposed therebetween.

Respective shapes, arrangement portions, and numbers of arrangements of the main terminals 60 and 61 and the control terminals are not limited to these, but are appropriately changeable. The auxiliary terminal 63 may be each referred to as an auxiliary emitter terminal or an auxiliary source terminal depending on the type of the semiconductor device 3.

Each of the control terminals and a predetermined electrode are electrically connected to each other via a circuit board and a bonding wire (that may be collectively referred to as a control wiring). Specifically, the gate electrode 31 of each of the semiconductor devices 3 is connected to the circuit board 25 via a gate wiring W1. The circuit board 25 is connected to the gate terminal 62 via a gate wiring W2. That is, the gate electrode 31 is electrically connected to the gate terminal 62 via the gate wiring W1, the circuit board 25, and the gate wiring W2.

Each of the first bonding sections 40 and the circuit board 24 are connected to each other by an auxiliary wiring W3. The circuit board 24 is connected to the auxiliary terminal 63 via an auxiliary wiring W4. That is, the main electrode 30*a* is electrically connected to the first auxiliary terminal 63 via the first bonding section 40, the auxiliary wiring W3, and the auxiliary wiring W4.

Although the auxiliary wiring W3 is configured to connect the first bonding section 40 and the circuit board 24 to each other in the present embodiment, the present invention is not limited to this configuration. The auxiliary wiring W3 may directly connect the main electrode 30*a* and the circuit board 24 to each other. The auxiliary wiring W3 may be referred to as a first auxiliary wiring.

The circuit board 23 and the circuit board 24 are connected to each other by an auxiliary wiring W5. That is, the circuit board 23 and the auxiliary terminal 63 are electrically connected to each other via the auxiliary wiring W5, the circuit board 24, and the auxiliary wiring W4. An angle formed between the auxiliary wiring W5 and the auxiliary wiring W3 is preferably 90 degrees or less, which will be described in detail below.

A wire (bonding wire) having conductivity is used for the above-described wirings W1 to W5. Any one of gold, copper, aluminum, a gold alloy, a copper alloy, and an aluminum alloy or their combination can be used as a material for the wire. A member other than the wire can also be used as the wirings. For example, a ribbon can be used for a wiring member.

Thus, in the present embodiment, there are provided between the upper surface electrode (the main electrode 30*a*) of the semiconductor device 3 and the auxiliary terminal 63 a first path R1 electrically connected to the auxiliary terminal 63 from the upper surface electrode (the main electrode 30*a*) via the auxiliary wiring W3 and a second path R2 electrically connected to the auxiliary terminal 63 from the upper surface electrode (the main electrode 30a) via the metal wiring board 4, the second circuit board 23, and the auxiliary wiring W5 in this order, as illustrated in FIG. 4.

A main current path R electrically connected to the main terminal 61 from the main terminal 60 via the circuit board 22, the main electrodes 30b and 30a of the semiconductor device 3, the metal wiring board 4, and the circuit board 23 in this order is provided between the main terminals 60 and 61. A gate path electrically connected to the gate terminal 62 from the gate electrode 31 via the gate wiring W1, the circuit board 25, and the gate wiring W2 in this order is provided between the gate electrode 31 and the gate terminal 62 (a path from the gate electrode 31 to the gate terminal 62 in FIG. 4).

An internal space defined by the frame-shaped case 5 is filled with sealing resin 7. The sealing resin 7 seals the laminate substrate 2, the plurality of semiconductor devices 3, the metal wiring board 4, the wirings W1 to W5, and the like in the above-described space. That is, the case 5 defines (forms) an internal space accommodating the components (the laminate substrate 2, the plurality of semiconductor devices 3, the metal wiring board 4, the wirings W1 to W5, and the like). The internal space may be referred to as an internal region.

The sealing resin 7 is composed of thermosetting resin. The sealing resin 7 preferably includes at least one of epoxy, silicone, urethane, polyimide, polyamide, and polyamide-imide. Epoxy resin in which a filler is mixed, for example, is preferable in terms of insulation, heat resistance, and heat dissipation.

In a semiconductor apparatus, gate wirings are respectively connected as control wirings to gate electrodes of semiconductor devices. The gate wirings are respectively required to control switching operations of the semiconductor devices, and are respectively provided in the semiconductor devices.

Auxiliary wirings (that may be referred to as auxiliary source wirings or auxiliary emitter wirings) are respectively provided in the semiconductor devices to correspond to the gate wirings. The auxiliary wiring makes it possible to stably apply a control voltage between main electrodes (that may be referred to as "between a gate and a source" or "between a gate and an emitter") on upper and lower surfaces of each of the semiconductor devices even if a potential difference occurs because a main current flows through a main circuit, and also makes it possible to suppress oscillation and a delay of a switching time period that can occur when an on-off timing (switching timing) of each of the semiconductor devices shifts.

The above-described auxiliary wiring is preferably arranged at a position at a potential (that may be referred to as an auxiliary source potential or an auxiliary emitter potential) relatively spaced apart from the main circuit through which the main current flows in order to separate from the main circuit. Examples of the position include the vicinity and the upper surface of the semiconductor device. On the other hand, when one end of the auxiliary wiring is connected to the vicinity and the upper surface of the semiconductor device, a bonding section of the auxiliary wiring may be broken upon early deteriorating by a heat stress and a heat cycle caused by switching of the main current. This type of control wiring has a smaller cross-sectional area than that of a wiring constituting the main circuit because current is smaller than that flowing through the main circuit. Further, the control wiring may be formed of a bonding wire having a small wire diameter, and tends to be relatively easily disconnected.

Since the above-described gate wiring is also bonded to the upper surface of the semiconductor device, there can occur a similar phenomenon to that in the auxiliary wiring. However, if the gate wiring is disconnected, a gate potential is undefined, whereby switching of the semiconductor device is not turned on.

On the other hand, when the auxiliary wiring is disconnected, respective reference potentials of a control circuit (drive circuit) and the main circuit are not determined so that an overvoltage may be applied to the gate electrode. As a result, it is assumed that the semiconductor device or the control circuit may be destroyed by the overvoltage. That is, in a power module in which a large current is handled, it can be said that an influence of the disconnection of the auxiliary wiring on the entire apparatus is larger than that of the disconnection of the gate wiring.

The present invention has occurred to the present inventors for the purpose of preventing the apparatus from being immediately destroyed even if the auxiliary wiring is disconnected and early finding the disconnection to stably stop the apparatus.

In the present invention, there are provided, in addition to a conventional auxiliary wiring (first auxiliary wiring), another auxiliary wiring (second auxiliary wiring). The first auxiliary wiring is connected to a portion relatively close to a semiconductor device (e.g., an upper surface of the semiconductor device), while the second auxiliary wiring is connected to a portion relatively spaced apart from the semiconductor device. This makes it more difficult for the second auxiliary wiring to be relatively affected by heat of the semiconductor device than the first auxiliary wiring. Therefore, the life of the second auxiliary wiring can be made longer than that of the first auxiliary wiring. Therefore, even if the first auxiliary wiring is disconnected, the second auxiliary wiring still remains. Accordingly, the apparatus is not immediately destroyed. Respective changes in signals of the first auxiliary wiring and the second auxiliary wiring make it possible to early find the disconnection of the first auxiliary wiring and to stably stop the apparatus.

Figure 5A:
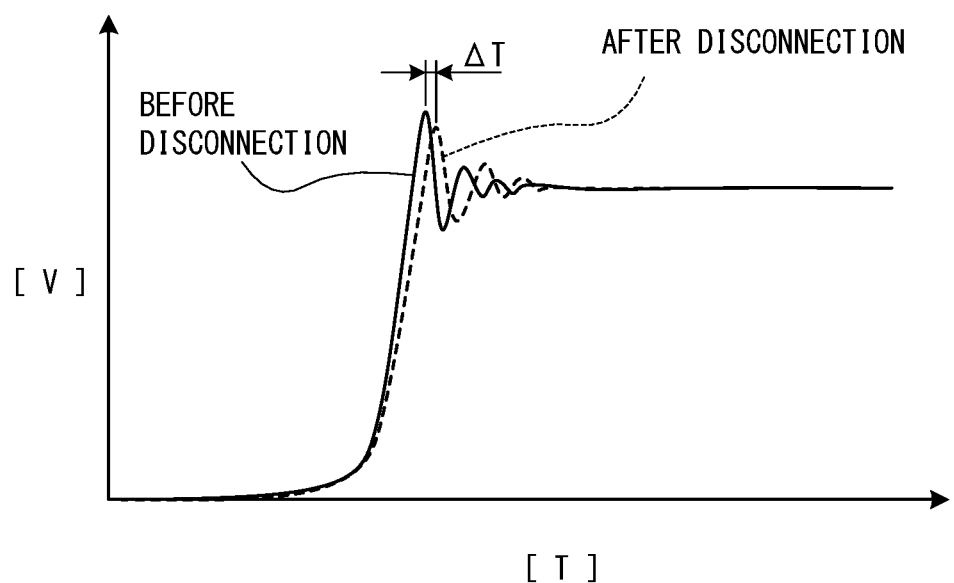
FIG. 5A and FIG. 5B are graphs illustrating an output change at the time of a switching operation.
Figure 5B:
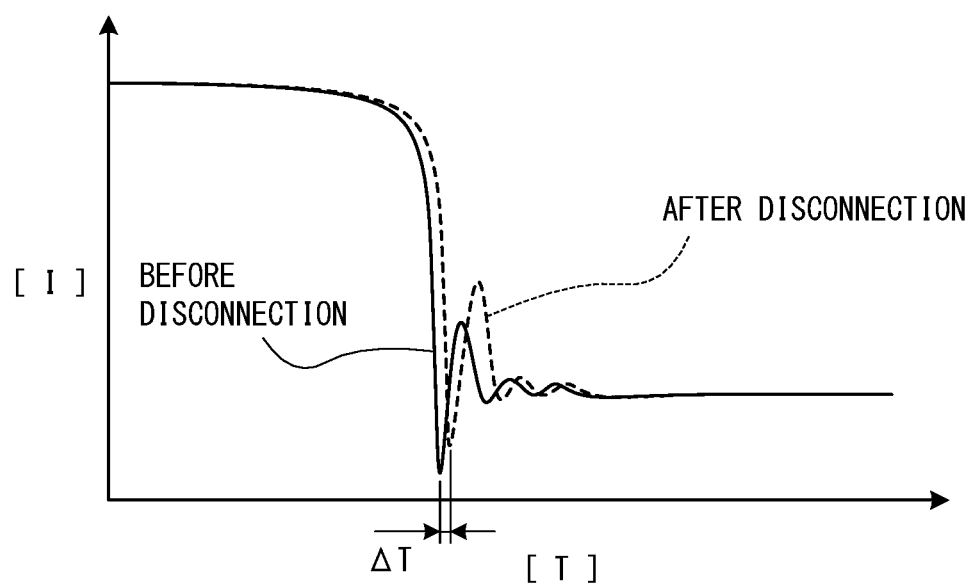

Output changes before and after the first auxiliary wiring is disconnected will be described with reference to FIG. 5. FIG. 5 is a graph illustrating output changes at the time of a switching operation. Specifically, FIG. 5A illustrates voltage changes with time, and FIG. 5B illustrates current changes with time. In FIG. 5A, a horizontal axis represents time, and a vertical axis represents a voltage. In FIG. 5B, a horizontal axis represents time, and a vertical axis represents a current. In both FIG. 5A and FIG. 5B, a solid line indicates the output change before the disconnection, and a broken line indicates the output change after the disconnection.

As illustrated in FIGS. 5A and 5B, before the first auxiliary wiring is disconnected, i.e., when the semiconductor module 1 is operating in a normal operation, if switching is turned on (or off), an output greatly changes at a predetermined timing (see a solid line portion in FIG. 5).

On the other hand, when the first auxiliary wiring is disconnected, respective reference potentials of a control circuit and the semiconductor device are kept via the second auxiliary wiring. Accordingly, the control circuit or the semiconductor device can be prevented from being destroyed. A switching speed can be intentionally delayed via the second auxiliary wiring. Specifically, when the first auxiliary wiring is disconnected, a timing at which the output greatly changes because the switching is turned on (or off) shifts by ΔT, as indicated by a broken line portion in FIG. 5.

Thus, if it can be detected on the apparatus side that the switching timing has been delayed by ΔT period, it can be early found that the first auxiliary wiring has been disconnected. In this case, an operation of the apparatus itself is not unstable. Thus, the apparatus can be safely stopped.

Therefore, in the present invention, if the first auxiliary wiring is disconnected because the second auxiliary wiring is provided for backing up the first auxiliary wiring, the reference potential of the circuit is ensured via the second auxiliary wiring instead. As a result, the entire apparatus can be prevented from being immediately destroyed. Further, when a switching operation via the second auxiliary wiring is delayed, the disconnection of the first auxiliary wiring can be easily detected.

Figure 6:
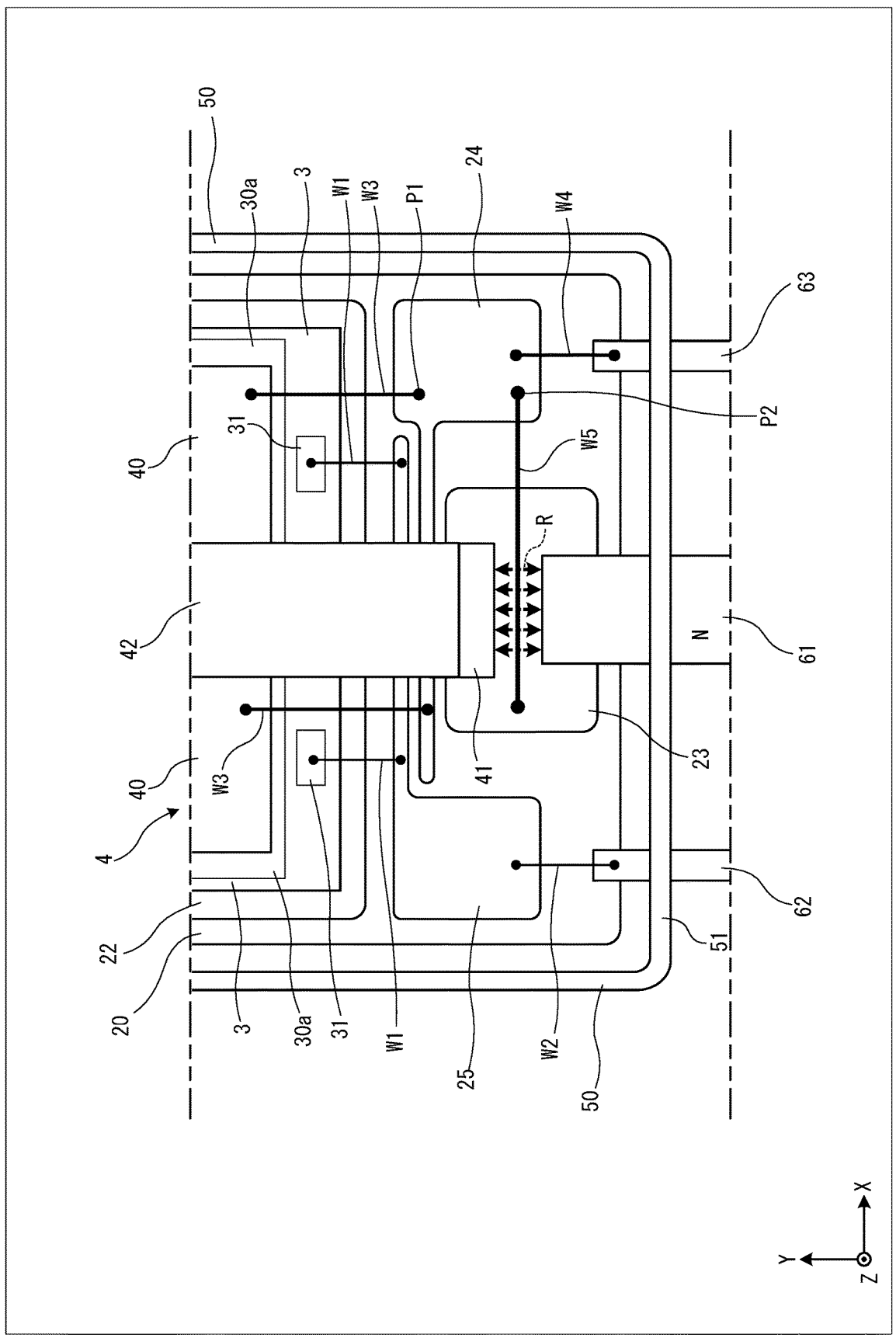
FIG. 6 is a partial enlarged view of FIG. 1.

A specific wiring structure in the present embodiment will be described below. FIG. 6 is a partial enlarged view of FIG. 1.

As illustrated in FIGS. 1 and 6, in the present embodiment, the wiring structure includes a plurality of semiconductor devices 3 each having a main electrode 30a and a gate electrode 31 formed on its upper surface, a laminate substrate 2 in which a plurality of circuit boards are arranged on an upper surface of an insulating plate 20, a main terminal 61 to be electrically connected to the main electrodes 30a, a gate terminal 62 to be electrically connected to the gate electrodes 31, an auxiliary terminal 63 to be each electrically connected to the main electrodes 30a, and a metal wiring board 4 that electrically connects the main electrodes 30a and the main terminal 61 to each other.

The plurality of circuit boards include a circuit board 22 (a first circuit board) having the semiconductor devices 3 arranged on its upper surface and a circuit board 23 (a second circuit board) that electrically connects the main terminal 61 and the metal wiring board 4 to each other. The gate electrode 31 and the gate terminal 62 are connected to each other via a gate wiring W1. The main electrode 30a or the metal wiring board 4 and the auxiliary terminal 63 are connected to each other via an auxiliary wiring W3 (a first auxiliary wiring). The circuit board 23 and the auxiliary terminal 63 are connected to each other by an auxiliary wiring W5 (a second auxiliary wiring).

In this case, a first connection point (P1) of the auxiliary wiring W3 is in the vicinity of the semiconductor device 3. On the other hand, a second connection point (P2) of the auxiliary wiring W5 is positioned in the circuit board 23 further spaced apart from the semiconductor device 3. Accordingly, the second connection point P2 of the auxiliary wiring W5 can be more spaced apart from the semiconductor device 3 than is the first connection point P1 of the auxiliary wiring W3. This makes it more difficult for the auxiliary wiring W5 to be affected by heat of the semiconductor device 3 than the auxiliary wiring W3. Further, the auxiliary wiring W3 is connected to a first bonding section 40 in the metal wiring board 4 connected to the main electrode 30a of the semiconductor device 3. On the other hand, the auxiliary wiring W5 is connected to the circuit board 23. The circuit board 23 does not easily increase in temperature because it is cooled via the insulating plate 20 and a heat dissipation plate 21. This makes it more difficult for the auxiliary wiring W5 to be affected by heat of the semiconductor device 3 than the auxiliary wiring W3. As a result, the life of the auxiliary wiring W5 can be made longer than that of the auxiliary wiring W3. Therefore, the auxiliary wiring W5 can be effectively utilized for backing up the auxiliary wiring W3.

In the present embodiment, a circuit board 24 (a third circuit board) and a circuit board 25 (a fourth circuit board) that are independent of each other are provided. The circuit board 24 relays the auxiliary wiring W3 and an auxiliary wiring W4 between the main electrode 30a and the auxiliary terminal 63. The circuit board 24 relays the auxiliary wirings W5 and W4 between the circuit board 23 and the auxiliary terminal 63. The circuit board 25 relays the gate wiring W1 and a gate wiring W2 between the gate electrode 31 and the gate terminal 62.

Thus, when the independent circuit board 24 or 25 is set as a relay portion of wirings, a space of a connection point (bonding portion) of a wiring from the semiconductor device 3 can be more sufficiently ensured than when the wiring is directly connected to the control terminal (the auxiliary terminal 63 or the gate terminal 62). As a result, the control terminal can be miniaturized to a minimum size.

The circuit boards 23 and 24 are preferably at the same potential. This configuration makes it possible to ensure respective reference potentials of a control circuit and a main circuit.

In the circuit board 24, a second connection point of the auxiliary wiring W5 is preferably more spaced apart from the semiconductor device 3 than is a first connection point of the auxiliary wiring W3. This configuration makes it possible to make the auxiliary wiring W5 longer than the auxiliary wiring W3.

A current path from the semiconductor device 3 via the auxiliary wiring W5 is preferably longer than a current path from the semiconductor device 3 via the auxiliary wiring W3. In other words, an impedance in the current path from the semiconductor device 3 via the auxiliary wiring W5 is preferably larger than an impedance in the current path from the semiconductor device 3 via the auxiliary wiring W3. According to these configurations, a difference occurs in impedance in a predetermined current path, thereby making it possible to make a difference between switching speeds (timings) before and after the auxiliary wiring W3 is disconnected. Therefore, when the difference is detected on the apparatus side, the presence or absence of the disconnection can be recognized.

As illustrated in FIG. 6, in the circuit board 23, the second connection point P2 of the auxiliary wiring W5 is preferably provided at a position shifting from a main current path R between the metal wiring board 4 (a second bonding section 41) and the main terminal 61. More specifically, the second connection point P2 of the auxiliary wiring W5 may be formed at a position deviating from (away from) a region connecting a bonding portion of the metal wiring board 4 (the second bonding section 41) and a bonding portion of the main terminal 61. The second connection point P2 of the auxiliary wiring W5 is more preferably provided at a position farther from the main terminal 61 than the bonding portion of the metal wiring board 4 (the second bonding section 41). According to this configuration, the current path via the auxiliary wiring W5 can be made difficult to be easily affected by a main current because it separates from the main circuit.

In the present embodiment, an angle formed between the auxiliary wiring W3 and the auxiliary wiring W5 is preferably 90 degrees or less in a planar view. This configuration makes it possible to make a difference between the respective current paths via the auxiliary wirings W3 and W5.

One or more auxiliary wirings W3 are arranged for the plurality of semiconductor devices 3 connected in parallel. The one auxiliary wiring W3 is preferably arranged to correspond to each of the plurality of semiconductor devices connected in parallel. According to this configuration, the auxiliary wiring W3 corresponding to each of the semiconductor devices 3 is provided, thereby making it possible to stably perform switching control.

In the present embodiment, the semiconductor device 3 is preferably formed of a wide bandgap semiconductor. The wide bandgap semiconductor can pass a larger current and can perform a higher temperature operation than a silicon semiconductor. This configuration more significantly exhibits an effect of the present invention in a semiconductor module that is operated with a large current and at a high temperature using the wide bandgap semiconductor.

As described above, according to the present embodiment, the second auxiliary wiring for backup is provided in addition to the first auxiliary wiring, and there occurs a difference between the switching timings before and after the first auxiliary wiring is disconnected, thereby making it possible to early find the disconnection to prevent the apparatus from being destroyed in advance.

Figure 7:
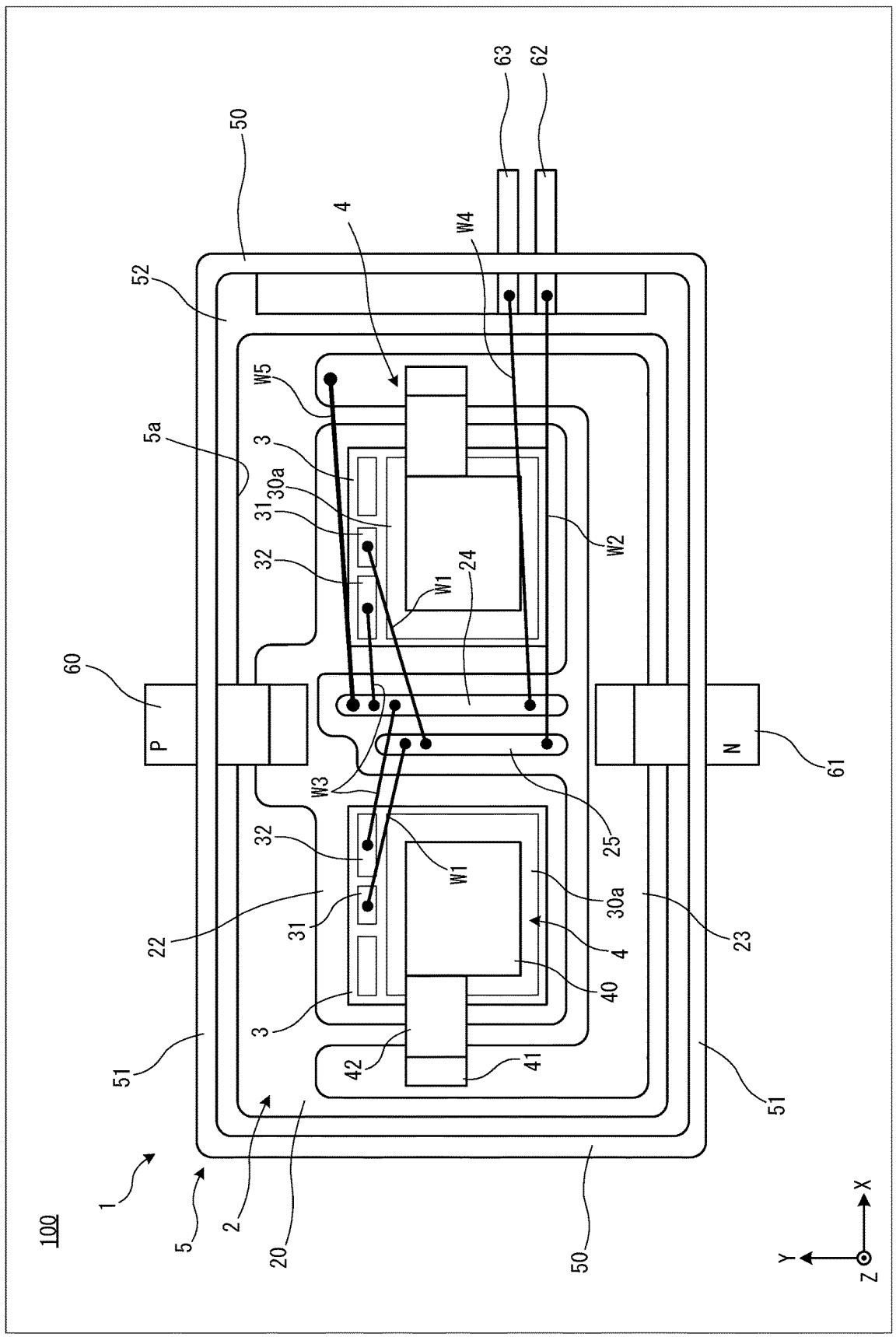
FIG. 7 is a plan view illustrating a semiconductor apparatus according to a modification.
Figure 8:
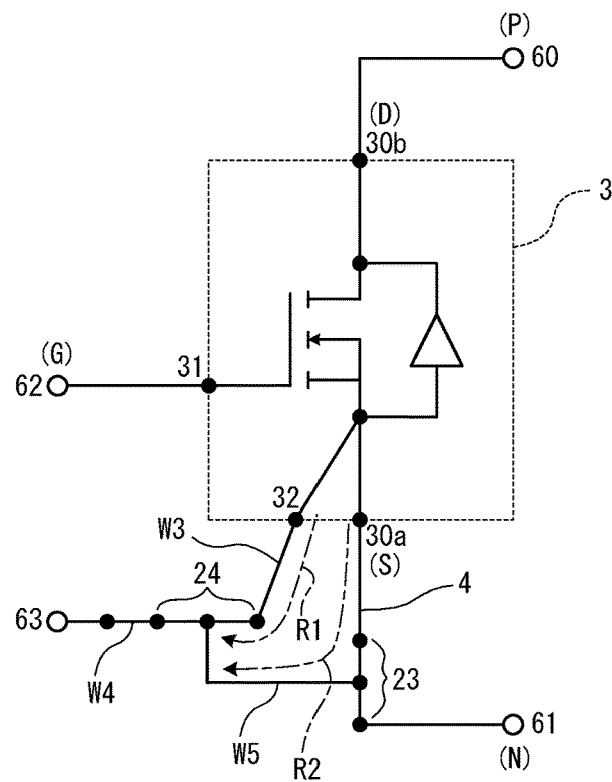
FIG. 8 is an equivalent circuit diagram of the semiconductor apparatus according to the modification illustrated in FIG. 7.
Figure 9:
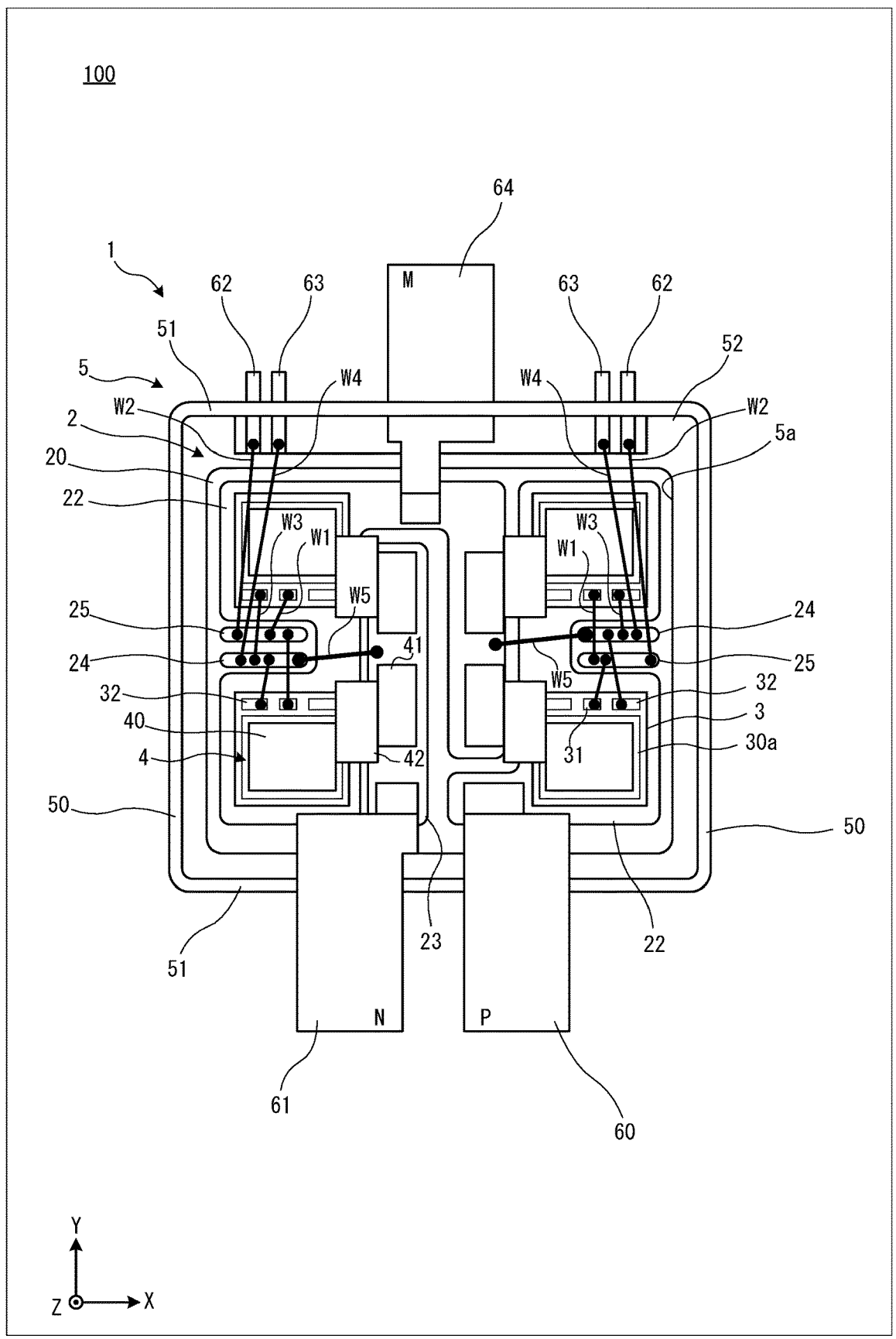
FIG. 9 is a plan view illustrating a semiconductor apparatus according to another modification.
Figure 10:
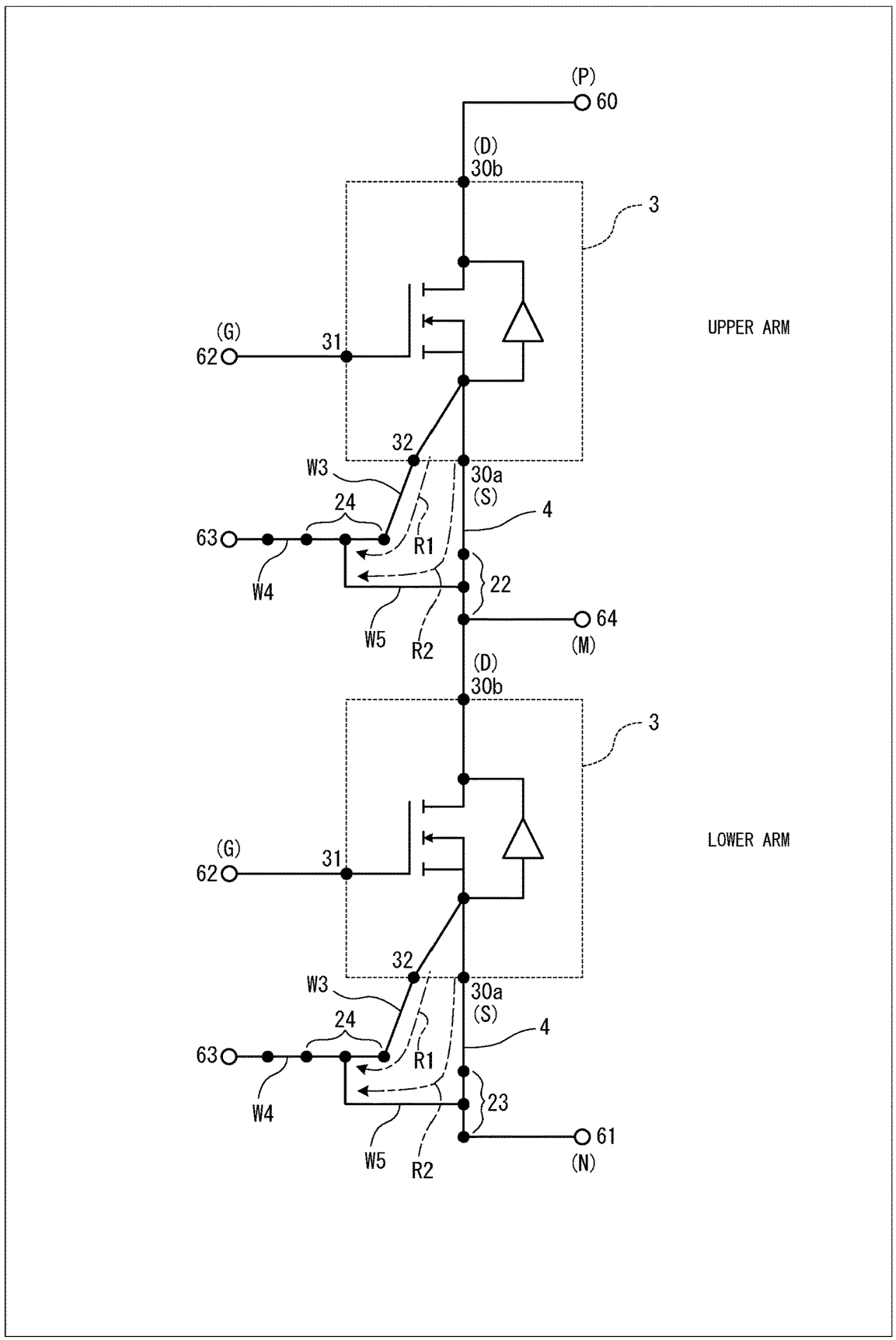
FIG. 10 is an equivalent circuit diagram of the semiconductor apparatus according to the modification illustrated in FIG. 9.
Figure 11:
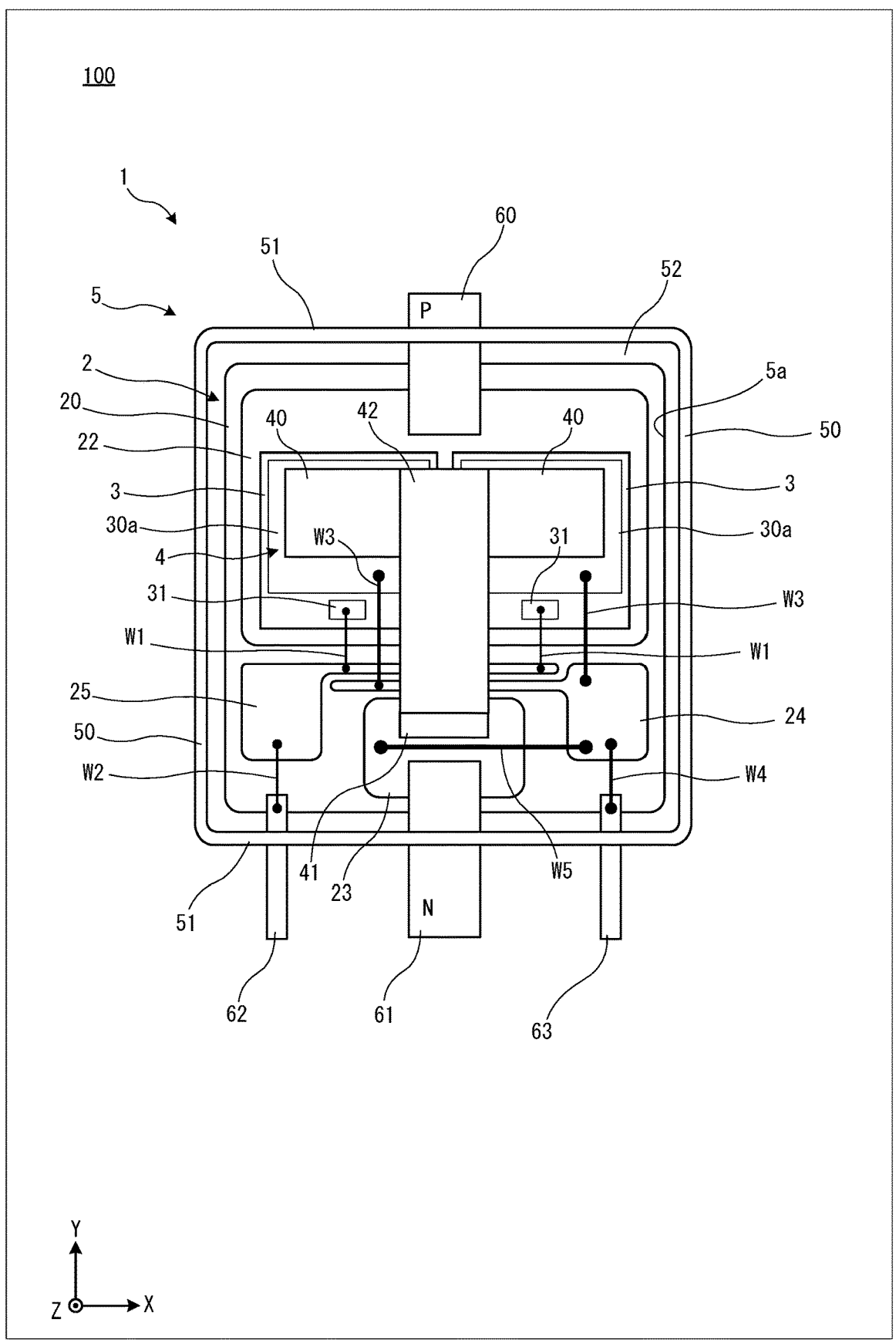
FIG. 11 is a plan view of a semiconductor apparatus illustrating a variation of FIG. 1.

Then, modifications will be described with reference to FIGS. 7 to 11. FIG. 7 is a plan view illustrating a semiconductor apparatus according to a modification. FIG. 8 is an equivalent circuit diagram of the semiconductor apparatus according to the modification illustrated in FIG. 7. FIG. 9 is a plan view illustrating a semiconductor apparatus according to another modification. FIG. 10 is an equivalent circuit diagram of the semiconductor apparatus according to the modification illustrated in FIG. 9. FIG. 11 is a plan view of a semiconductor apparatus illustrating a variation of FIG. 1. In the following modification, existing components are respectively indicated by the same names and the same reference numerals, to appropriately omit description. In the modification, differences will be mainly described.

A semiconductor module 1 illustrated in FIGS. 7 and 8 has a rectangular shape in a planar view that is long in an X-direction. In FIG. 7, a circuit board 23 has a U shape in a planar view, and a circuit board 22 is arranged inside the U shape. A notch extending in a Y-direction is formed at the center of the circuit board 22. Circuit boards 24 and 25 are arranged in the notch. The circuit boards 24 and 25 each have an elongated shape extending in the Y-direction, and are arranged side by side in the X-direction. The circuit board 24 is positioned on the positive side in the X-direction, and the circuit board 25 is positioned on the negative side in the X-direction.

An auxiliary electrode 32 is formed separately from a main electrode 30a on an upper surface of a semiconductor device 3. The auxiliary electrode 32 may be electrically connected to the main electrode 30a. In FIG. 7, one metal wiring board 4 is provided for each semiconductor device 3. A side wall 50 of a case is shorter than the side wall 51. A gate terminal 62 and an auxiliary terminal 63 are embedded in the side wall 50 on the positive side in the X-direction, and are arranged side by side in the Y-direction. The auxiliary terminal 63 is positioned on the positive side in the Y-direction, and the gate terminal 62 is positioned on the negative side in the Y-direction.

In FIG. 7, one end of an auxiliary wiring W3 is bonded to not the main electrode 30a but an upper surface of the auxiliary electrode 32. In this case, the main electrode 30a and the auxiliary electrode 32 are preferably at the same potential. In the modification illustrated in FIG. 7, wirings W1 to W5 do not overlap one another in a planar view. In such a layout, a similar function and effect to those in the above-described embodiment can also be obtained.

In the modification illustrated in FIGS. 7 and 8, there are provided between the upper surface electrode (the auxiliary electrode 32) of the semiconductor device 3 and the auxiliary terminal 63 a first path R1 electrically connected to the auxiliary terminal 63 from the upper surface electrode (the auxiliary electrode 32) via the auxiliary wiring W3 and a second path R2 electrically connected to the auxiliary terminal 63 from the upper surface electrode (the auxiliary electrode 32) via the metal wiring board 4, the second circuit board 23, and the auxiliary wiring W5 in this order.

In the modification illustrated in FIGS. 9 and 10, main terminals 60 and 61 are arranged side by side on a side wall 51 on the negative side in a Y-direction. On the other hand, another main terminal 64 is arranged on a side wall 51 on the positive side in the Y-direction. The main terminal 64 is connected to a circuit board 22. The main terminal 64 may be referred to as an intermediate terminal (M terminal).

In FIG. 9, two circuit boards 22 each having a portion extending in the Y-direction are arranged side by side in an X-direction. Two semiconductor devices 3 are arranged side by side in the Y-direction in each of the circuit boards 22. That is, in the modification illustrated in FIG. 9, the four semiconductor devices 3 are arranged to form a matrix of two by two. For example, the two semiconductor devices 3 on the positive side in the X-direction may constitute an upper arm, and the two semiconductor devices 3 on the negative side in the X-direction may constitute a lower arm.

A notch extending in the X-direction is formed at the center of each of the circuit boards 22. Circuit boards 24 and 25 are arranged in the notch. The circuit boards 24 and 25 each have an elongated shape extending in the X-direction, and are arranged side by side in the Y-direction.

In FIG. 9, control terminals (a gate terminal 62 and an auxiliary terminal 63) are paired, and the paired two control terminals are arranged in each of the upper and lower arms. That is, the two pairs of gate terminals 62 and auxiliary terminals 63 are arranged. The gate terminals 62 and the auxiliary terminals 63 are arranged on the side wall 51 on the positive side in the Y-direction. The pair of control terminals on the upper arm side is arranged on the positive side in the X-direction, and the pair of control terminals is arranged on the negative side in the X-direction. The above-described wiring is connected to each of the terminals. In such a configuration, a similar function and effect to those in the above-described embodiment can also be obtained.

In the modification illustrated in FIGS. 9 and 10, there are provided between an upper surface electrode (an auxiliary electrode 32) of the semiconductor device 3 and the auxiliary terminal 63 a first path R1 electrically connected to the auxiliary terminal 63 from the upper surface electrode (the auxiliary electrode 32) via an auxiliary wiring W3 and a second path R2 electrically connected to the auxiliary terminal 63 from the upper surface electrode (the auxiliary electrode 32) via a metal wiring board 4, a second circuit board 23, and an auxiliary wiring W5 in this order.

Although a case where one end of the auxiliary wiring W3 is connected to an upper surface of the first bonding section 40 has been described in the embodiment illustrated in FIG. 1, the present invention is not limited to this configuration. As illustrated in FIG. 11, for example, one end of an auxiliary wiring W3 is directly connected to an upper surface of a main electrode 30a.

Figure 12:
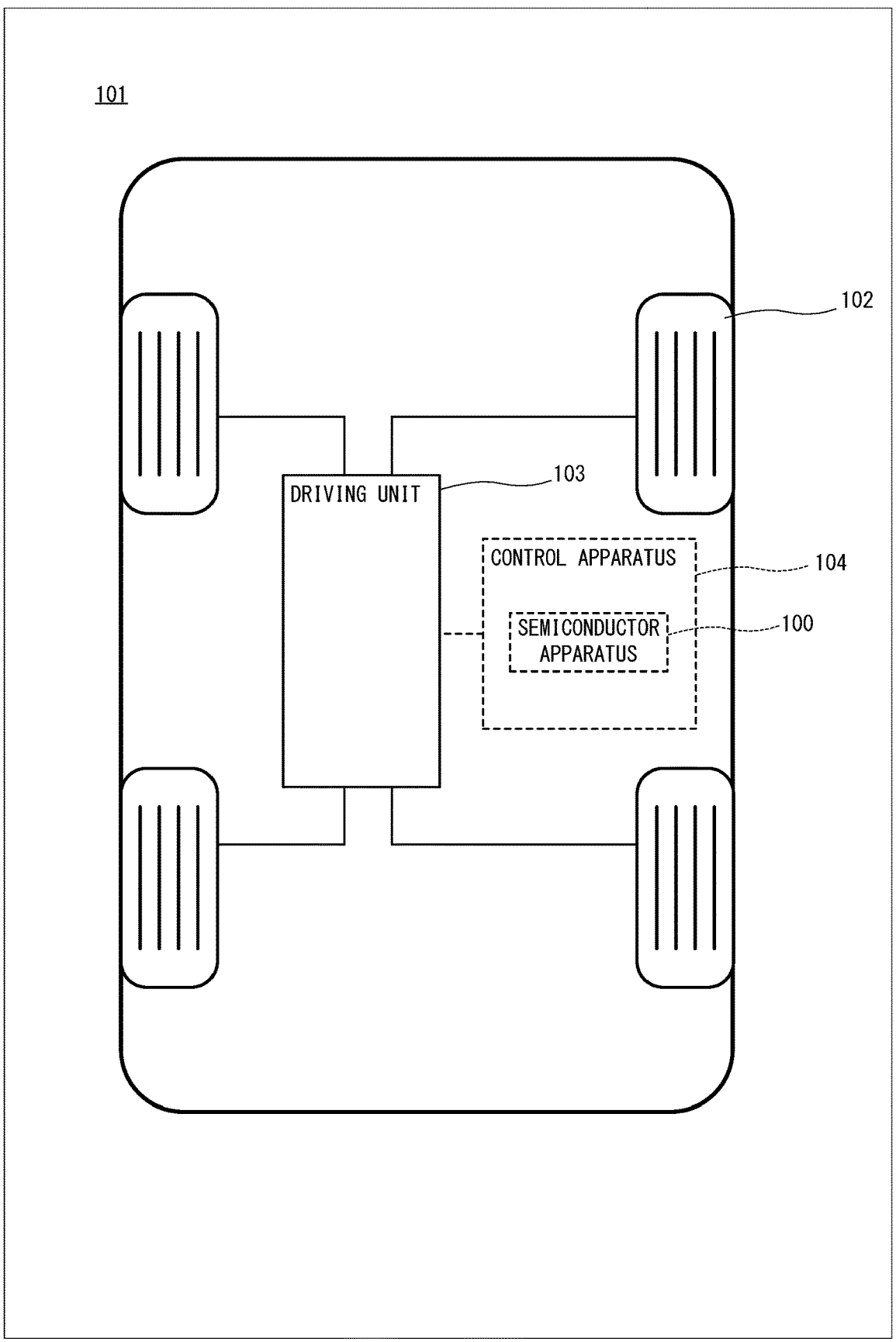
FIG. 12 is a schematic plan view illustrating an example of a vehicle to which the semiconductor apparatus according to the present invention is applied.

A vehicle to which the present invention is applied will be described with reference to FIG. 12. FIG. 12 is a plan schematic view illustrating an example of the vehicle to which the semiconductor apparatus according to the present invention is applied. A vehicle 101 illustrated in FIG. 12 includes four-wheel vehicle including four wheels 102, for example. An example of the vehicle 101 may be an electric vehicle that drives wheels by a motor or the like or a hybrid vehicle using power of an internal combustion engine in addition to a motor.

The vehicle 101 includes a driving unit 103 that applies power to the wheels 102 and a control apparatus 104 that controls the driving unit 103. The driving unit 103 may be composed of at least one of an engine, a motor, and a hybrid of an engine and a motor, for example.

The control apparatus 104 performs control (e.g., power control) of the above-described driving unit 103. The control apparatus 104 includes the above-described semiconductor apparatus 100. The semiconductor apparatus 100 may be configured to perform electric power control for the driving unit 103.

In the above-described embodiment, the number of semiconductor devices 3 and an arrangement portion of each of the semiconductor devices 3 are not limited to those in the above-described configuration, but are appropriately changeable.

In the above-described embodiment, the number of circuit boards and a layout of the circuit boards are not limited to those in the above-described configuration, but are appropriately changeable.

Although the laminate substrate 2 and the semiconductor device 3 are components each formed into a rectangular shape or a square shape in a planar view in the above-described embodiment, the present invention is not limited to the shape. The components may be each formed into a polygonal shape other than the above-described shape.

Although the present embodiment and the modifications have been described, the present invention may be an overall or partial combination of the above-described embodiment and modifications as another embodiment.

The present embodiment is not limited to the above-described embodiment and modifications, but various changes, replacements, and modifications may be made without departing from the scope of the technical idea. Further, if the technical idea can be implemented in another method by advancement of technology or derivative other technology, the technical idea may be implemented using the method. Therefore, the claims cover all embodiments that can be included in the scope of the technical idea.

Feature points in the above-described embodiment are summarized below.

A semiconductor module according to the above-described embodiment includes at least one semiconductor device having a plurality of upper surface electrodes including at least a first main electrode formed on its upper surface, a laminate substrate in which a plurality of circuit boards including a first circuit board, on which the at least one semiconductor device is arranged, and a second circuit board are arranged on an upper surface of an insulating plate, a first main terminal to be electrically connected to the first main electrode, an auxiliary terminal to be electrically connected to the upper surface electrode, and a main current wiring member that electrically connects the first main electrode and the first main terminal to each other, in which a main current path electrically connected to the first main terminal from the first main electrode via the main current wiring member and the second circuit board in this order is provided between the first main electrode and the first main terminal, a first path electrically connected to the auxiliary terminal from the upper surface electrode via a first auxiliary wiring is provided between the upper surface electrode and the auxiliary terminal, and a second path electrically connected to the auxiliary terminal from the upper surface electrode via the main current wiring member, the second circuit board, and a second auxiliary wiring in this order.

In the semiconductor module according to the above-described embodiment, the main current wiring member is composed of a plate-shaped member made of a metal, and the first auxiliary wiring and the second auxiliary wiring are each composed of a wire made of a metal.

In the semiconductor module according to the above-described embodiment, one end of the first auxiliary wiring is connected to an upper surface of the main current wiring member arranged to oppose the first main electrode.

In the semiconductor module according to the above-described embodiment, one end of the first auxiliary wiring is connected to an upper surface of the first main electrode.

In the semiconductor module according to the above-described embodiment, the at least one semiconductor device further includes an auxiliary electrode electrically connected to the first main electrode as the upper surface electrode, and one end of the first auxiliary wiring is connected to an upper surface of the auxiliary electrode.

In the semiconductor module according to the above-described embodiment, a connection point of the second auxiliary wiring is more spaced apart from the at least one semiconductor device than a connection point of the first auxiliary wiring.

In the semiconductor module according to the above-described embodiment, the plurality of circuit boards further include a third circuit board that relays the first auxiliary wiring and/or the second auxiliary wiring to the auxiliary terminal.

In the semiconductor module according to the above-described embodiment, a second connection point of the second auxiliary wiring is more spaced apart from the at least one semiconductor device than is a first connection point of the first auxiliary wiring in the third circuit board. In other words, the first connection point P1 is closer to the semiconductor device 3 than is the second connection point P2.

In the semiconductor module according to the above-described embodiment, the at least one semiconductor device further includes a gate electrode as the upper surface electrode, the semiconductor module further including a gate terminal to be electrically connected to the gate electrode, in which there is provided between the gate electrode and the gate terminal a gate path electrically connected to the gate terminal from the gate electrode via a gate wiring bonded to the gate electrode and a fourth circuit board further provided as one of the plurality of circuit boards in this order.

In the semiconductor module according to the above-described embodiment, the second path is longer than the first path.

In the semiconductor module according to the above-described embodiment, an impedance of the second path is larger than an impedance of the first path.

In the semiconductor module according to the above-described embodiment, a second connection point of the second auxiliary wiring is provided at a position away from a main current path between the main current wiring member and the first main terminal in the second circuit board.

In the semiconductor module according to the above-described embodiment, an angle formed between the first auxiliary wiring and the second auxiliary wiring is 90 degrees or less in a planar view.

In the semiconductor module according to the above-described embodiment, the first auxiliary wiring is arranged for each of the plurality of semiconductor devices.

In the semiconductor module according to the above-described embodiment, the at least one semiconductor device is formed of a wide bandgap semiconductor.

A semiconductor apparatus according to the above-described embodiment includes the above-described semiconductor module, and a cooler arranged on a lower surface of the laminate substrate.

A vehicle according to the above-described embodiment includes the above-described semiconductor module, or the semiconductor apparatus.

As described above, the present invention has an effect of enabling disconnection of a specific wiring to be early found, and is particularly useful in a semiconductor module and a semiconductor apparatus for industrial or electrical (in-vehicle) use.

REFERENCE SIGNS LIST 1 semiconductor module
2 laminate substrate
3 semiconductor device
4 metal wiring board (main current wiring member)
5 case
5a opening section
7 sealing resin
10 cooler
20 insulating plate
21 heat dissipation plate
22 circuit board (first circuit board)
23 circuit board (second circuit board)
24 circuit board (third circuit board)
25 circuit board (fourth circuit board)
30a main electrode (upper surface electrode, first main electrode)
30b main electrode (lower surface electrode, second main electrode)
31 gate electrode (upper surface electrode, control electrode)
32 auxiliary electrode (upper surface electrode, control electrode)
40 first bonding section
41 second bonding section
42 connection section
50 side wall
51 side wall
52 stepped section
60 main terminal (P terminal, second main terminal)
61 main terminal (N terminal, first main terminal)
62 gate terminal
63 auxiliary terminal
64 main terminal (M terminal, third main terminal)
100 semiconductor apparatus
101 semiconductor apparatus
102 vehicle
103 driving unit
104 control apparatus
R main current path
R1 first path
R2 second path
S bonding material
W1 gate wiring
W2 gate wiring
W3 auxiliary wiring (first auxiliary wiring)
W4 auxiliary wiring
W5 auxiliary wiring (second auxiliary wiring)

What is claimed is:

1. A semiconductor module, comprising:
a semiconductor device having a plurality of upper surface electrodes including at least a main electrode disposed on an upper surface of the semiconductor device;
a laminate substrate including an insulating plate, and a plurality of circuit boards that includes a first circuit board and a second circuit board that are arranged on an upper surface of the insulating plate, the semiconductor device being disposed on the first circuit board;
a main terminal electrically connected to the main electrode;
an auxiliary terminal electrically connected to one of the plurality of upper surface electrodes via a first auxiliary wiring or a second auxiliary wiring; and
a main current wiring member electrically connecting the main electrode to the main terminal, wherein
a main current path through which a main current flows is provided between the main electrode and the main terminal, the main current flowing to the main terminal from the main electrode via the main current wiring member and the second circuit board in this order, and
a first path through which a first control current flows and a second path through which a second control current flows are provided between the one of the plurality of upper surface electrodes and the auxiliary terminal, the first control current flowing to the auxiliary terminal from the one of the plurality of upper surface electrodes via the first auxiliary wiring, the second control current flowing to the auxiliary terminal from the one of the plurality of upper surface electrodes via the main current wiring member, the second circuit board and the second auxiliary wiring in this order.

2. The semiconductor module according to claim 1, wherein
the main current wiring member is a plate-shaped member made of a metal, and
the first auxiliary wiring and the second auxiliary wiring each are a wire made of a metal.

3. The semiconductor module according to claim 2, wherein
the main current wiring member has an upper main surface and a lower main surface opposite to each other, the lower main surfaces facing the main electrode, and
one end of the first auxiliary wiring is connected to the upper main surface of the main current wiring member.

4. The semiconductor module according to claim 1, wherein one end of the first auxiliary wiring is connected to an upper surface of the main electrode.

5. The semiconductor module according to claim 1, wherein
the plurality of upper surface electrodes of the semiconductor device further includes an auxiliary electrode electrically connected to the main electrode, and
one end of the first auxiliary wiring is connected to an upper surface of the auxiliary electrode.

6. The semiconductor module according to claim 1, wherein a first connection point between the first auxiliary wiring and the auxiliary terminals is closer to the semiconductor device than is a second connection point between the second auxiliary wiring and the auxiliary terminal.

7. The semiconductor module according to claim 1, wherein the plurality of circuit boards further includes a third circuit board that relays the first auxiliary wiring and/or the second auxiliary wiring to the auxiliary terminal.

8. The semiconductor module according to claim 7, wherein in the third circuit board, a first connection point between the first auxiliary wiring and the auxiliary terminals is closer to the semiconductor device than is a second connection point between the second auxiliary wiring and the auxiliary terminal.

9. The semiconductor module according to claim 1, wherein
the plurality of upper surface electrodes of the semiconductor device further includes a gate electrode to which a gate wiring is connected, and
the plurality of circuit boards further includes a fourth circuit board,
the semiconductor module further comprising a gate terminal electrically connected to the gate electrode, wherein
a gate path through which a gate current flows is provided between the gate electrode and the gate terminal, the gate current flowing to the gate terminal from the gate electrode, via the gate wiring and the fourth circuit board in this order.

10. The semiconductor module according to claim 1, wherein the second path is longer than the first path.

11. The semiconductor module according to claim 1, wherein an impedance of the second path is larger than an impedance of the first path.

12. The semiconductor module according to claim 1, wherein in the second circuit board, a connection point between the second auxiliary wiring and the auxiliary terminal is provided at a position away from a portion of the main current path between the main current wiring member and the main terminal.

13. The semiconductor module according to claim 1, wherein an angle formed between the first auxiliary wiring and the second auxiliary wiring is 90 degrees or less in a plan view of the semiconductor module.

14. The semiconductor module according to claim 1, wherein the semiconductor device and the first auxiliary wiring each are provided in plurality, and each of the plurality of semiconductor devices is connected to a corresponding one of the plurality of first auxiliary wirings.

15. The semiconductor module according to claim 1, wherein the semiconductor device is formed of a wide bandgap semiconductor.

16. A semiconductor apparatus, comprising:
the semiconductor module of claim 1; and
a cooler arranged on a lower surface of the laminate substrate opposite to the upper surface of the laminate substrate.

17. A vehicle comprising the semiconductor module of claim 1.

18. A vehicle comprising the semiconductor apparatus of claim 16.

* * * * *